(12) United States Patent
Takano et al.

(10) Patent No.: US 6,270,588 B1
(45) Date of Patent: Aug. 7, 2001

(54) MAGNETORESISTIVE EFFECT SENSOR, THIN-FILM MAGNETIC HEAD WITH THE SENSOR AND MANUFACTURING METHOD OF THE THIN-FILM MAGNETIC HEAD

(75) Inventors: Ken-ichi Takano; Masato Takahashi; Nobuya Oyama, all of Nagano (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 09/272,615

(22) Filed: Mar. 19, 1999

(30) Foreign Application Priority Data

Mar. 23, 1998 (JP) .................................................. 10-092271

(51) Int. Cl.$^7$ .................................................. H01F 10/32
(52) U.S. Cl. ......................................... 148/108; 29/603.08
(58) Field of Search ........................... 148/108; 29/603.08

(56) References Cited

U.S. PATENT DOCUMENTS

| | | |
|---|---|---|
| 5,206,590 | 4/1993 | Dieny et al. . |
| 5,422,571 | 6/1995 | Gurney et al. . |
| 6,123,780 * | 9/2000 | Kanai et al. .......................... 148/108 |
| 6,123,781 * | 9/2000 | Shimazawa .......................... 148/108 |

OTHER PUBLICATIONS

IEEE Transactions on Magnetics, vol. MAG–7, No. 1, pp. 150–154, Mar. 1971.
Physical Review B, vol. 43, No. 1, pp. 1297–1300, Jan. 1991.
J. Appl. Phys., vol. 69, No. 8, pp. 4774–4779, Apr. 15, 1991.
IEEE Transactions on Magnetics, vol. 30, No. 6, pp. 3801–3806, Nov. 6, 1994.

* cited by examiner

*Primary Examiner*—John Sheehan
(74) *Attorney, Agent, or Firm*—Armstrong, Westerman, Hattori, McLeland & Naughton, LLP

(57) ABSTRACT

A thin-film magnetic head having a spin valve effect multi-layered structure including a non-magnetic electrically conductive material layer, first and second ferromagnetic material layers separated by the non-magnetic electrically conductive material layer, and an anti-ferromagnetic material layer formed adjacent to and in physical contact with one surface of the second ferromagnetic material layer. This one surface is an opposite side from the non-magnetic electrically conductive material layer and the multi-layered structure has ends at its track-width direction. The head also has longitudinal bias means formed at both the track-width ends of the multi-layered structure, for providing a longitudinal magnetic bias to the multi-layered structure. The multi-layered structure and the longitudinal bias means are formed such that an angle between a direction of exchange coupling magnetic bias in the second ferromagnetic material layer produced by the exchange coupling with the anti-ferromagnetic material layer and a direction of the longitudinal magnetic bias in the second ferromagnetic material layer is more than 90° in at least part of the second ferromagnetic material layer.

6 Claims, 9 Drawing Sheets

MAGNETORESISTIVE EFFECT SENSOR, THIN-FILM MAGNETIC HEAD WITH THE SENSOR AND MANUFACTURING METHOD OF THE THIN-FILM MAGNETIC HEAD

FIELD OF THE INVENTION

The present invention relates to a magnetoresistive effect (MR) sensor especially using a giant magnetoresistive effect (GMR), such as spin valve effect, to a thin-film magnetic head with the MR sensor used in a HDD (Hard Disk Drive) unit for a computer, and to a manufacturing method of the thin-film magnetic head.

DESCRIPTION OF THE RELATED ART

Recent widespread use of personal computers has increased the popularity of network transmissions of digital information including for not only conventional numerical digital data but also digital image data. Thus, the amounts of information to be treated are dramatically increasing.

In order to process such massive amounts of digital information, it is necessary to use fast microprocessor units (MPU) and fast and reliable HDD units with large capacity. To realize such HDD units, high sensitivity and large output magnetic heads are required.

An anisotropic magnetoresistive effect (AMR) head utilizing an abnormal magnetoresistive effect of a ferromagnetic thin-film layer based upon so-called spin-orbit interaction, wherein electrical resistance of the ferromagnetic layer varies depending upon the electrical field, has been widely known. For example, IEEE Transaction on Magnetics, Vol. MAG-7, No. 1, pp. 150–154, March 1971 discloses such an AMR head.

A thin-film layer of NiFe, NiFeCo, FeCo or NiCo material usually forms the AMR sensor in such a head. However, the relative change in resistance $\Delta R/R$ of the NiFe thin-film layer, which exhibits most excellent soft magnetic characteristics among these materials, is merely 2–3 % at most. Thus, it was necessary to develop MR material with a greater magnetoresistance.

In order to satisfy the requirement for high sensitivity and high power magnetic heads, more recently, thin-film magnetic heads with MR sensors based on the spin valve effect of CMR characteristics have been proposed. For example, Physical Review B, Vol.43, No. 1, pp. 1297–1300, Jan. 1991, Journal of Applied Physics, Vol. 69, No. 8, pp. 4774–4779, Apr. 1991, IEEE Transaction on Magnetics, Vol. 30, No. 6, pp. 3801–3806, Nov. 1994, and U.S. Pat. Nos. 5,206,590 and 5,422,571 disclose these heads.

The spin valve effect thin-film structure includes first and second thin-film layers of a ferromagnetic material magnetically separated by a thin-filmlayer of non-magnetic metallicmaterial, and an adjacent layer of anti-ferromagnetic material is formed in physical contact with the second ferromagnetic layer to provide an exchange bias magnetic field by exchange coupling at the interface of the layers. The magnetization direction in the second ferromagnetic layer is constrained or maintained by the exchange coupling, hereinafter the second layer is called the "pinned layer". On the other hand, the magnetization direction of the first ferromagnetic layer is free to rotate in response to an externally applied magnetic field, hereinafter, the first layer is called the "free layer". The direction of the magnetization in the free layer changes between parallel and anti-parallel against the direction of the magnetization in the pinned layer, and hence the magneto-resistance greatly changes and the GMR characteristics are obtained.

The output characteristic of the spin valve effect MR sensor depends upon the angular difference of magnetization between the free and pinned ferromagnetic layers. The direction of the magnetization of the free layer is free to rotate in accordance with an external magnetic field. That of the pinned layer is theoretically fixed to a specific direction (referred to as "pinned direction") by the exchange coupling between this layer and an adjacently formed anti-ferromagnetic layer.

In fact, the spin valve effect MR sensor for the magnetic read head is fabricated by patterning the multi-layered spin valve effect MR sensor in a rectangular shape, by providing to the free layer the axis of easy magnetization along the track-width direction (longitudinal direction), and by providing to the pinned layer the exchange coupling bias magnetization along the sensor-height direction (transverse direction) which is perpendicular to the track-width direction so that magnetization directions of the free and pinned layers are kept orthogonal to each other under no magnetic field environment.

In this kind of spin valve effect MR sensor, the direction of the magnetization of the pinned layer may change or rotate by various reasons as follows.

(1) In general, at both end portions in the track-width direction of the spin valve effect MR sensor, hard magnet layers are formed for providing the longitudinal bias for a static magnetic field to the free layer so as to prevent non-linear magnetization in the free layer and non-reciprocal change in magnetization, called Barkhausen noise, from occuring. However, this longitudinal magnetic bias is applied not only to the free layer but also to the pinned layer causing the magnetization direction of the pinned layer at its both end portions to change or rotate.

(2) A sense current is applied to the spin valve effect MR sensor to flow toward a specific direction (against direction) to produce a magnetic field which will change the magnetization of the free layer to its longitudinal direction. However, since the magnetic field produced by the sense current does not have the same direction as the exchange coupling bias magnetization in the pinned layer, the magnetization direction of the pinned layer will change or rotate.

(3) Furthermore, since the exchange magnetic bias produced between the pinned layer and the anti-ferromagnetic layer has temperature dependency, the applied exchange magnetic bias to the pinned layer will be reduced in magnitude when the temperature of the spin valve effect MR sensor increases. This reduction of the exchange coupling bias may build up the change or rotation of the magnetization direction of the pinned layer.

If the direction of the magnetization changes, the angular difference between the pinned and free layers also changes and, therefore, the output characteristic also changes. Consequently, stabilizing the direction of the magnetization in the pinned layer is very important.

SUMMARY OF THE INVENTION

It is therefore an object of the present invention to resolve the aforementioned problems by using a new approach, and to provide an MR sensor, a thin-film magnetic head with the MR sensor and manufacturing method of the thin-film magnetic head, whereby improved output characteristics and an enlarged permissible temperature range can be expected.

According to the present invention, pinned direction and its distribution are determined with consideration of the rotation of magnetization in the pinned layer.

More particularly, a thin-film magnetic head according to the present invention has a spin valve effect multi-layered structure including a non-magnetic electrically conductive material layer, first and second ferromagnetic material layers (free and pinned layers) separated by the non-magnetic electrically conductive material layer, and an anti-ferromagnetic material layer formed adjacent to and in physical contact with one surface of the second ferromagnetic material layer. This one surface is an opposite side of the non-magnetic electrically conductive material layer. The multi-layered structure has ends at its track-width direction. The head also has longitudinal bias means formed at both the track-width ends of the multi-layered structure, for providing a longitudinal magnetic bias to the multi-layered structure. The multi-layered structure and the longitudinal bias means are formed such that an angle between a direction of exchange coupling magnetic bias in the second ferromagnetic material layer produced by the exchange coupling with the anti-ferromagnetic material layer and a direction of the longitudinal magnetic bias in the second ferromagnetic material layer (Hex angle) is more than 90° in at least part of the second ferromagnetic material layer.

The Hex angle, which is the angle between the direction of the exchange coupling magnetic bias applied to the pinned layer (pinned direction) and the longitudinal bias direction (reference direction), is set to an angle of more than 90° at least part of the pinned layer. Thus, after the magnet magnetization process is executed, the angles θp in the pinned layer become substantially 90° (θp≈90°). As a result, improved output characteristics, namely improved output wave shape and improved wave symmetry, and also enlarged permissible temperature range can be expected.

In general, the pinned layer suffers influences of the longitudinal magnetic field Hhm, applied external magnetic field Happl, magnetic field induced by the sense current His and self-demagnetization magnetic field of the pinned layer Hdp other than the exchange coupling magnetic bias Hex. If the magnetization in the free layer is directed toward the longitudinal direction, the track-width of the spin valve effect multi-layered structure is greater than its height and the anisotropic magnetic field of the pinned layer Hk is small, the magnetization angle of the pinned layer θp is given as follows:

$$\theta p = \tan^{-1}\{(Hex+Happl+His-0.5\ Hdp)\cdot tp/(Hhm\cdot thm)\}$$

where tp is a thickness of the pinned layer and thm is a thickness of the longitudinal bias means.

The applied external magnetic field Happl varies between a positive and a negative level and the sense current magnetic field His is typically a negative level (if positive, it will be up to 20 Oe at the sense current of 5 mA). Therefore, in order to control the magnetization angle of the pinned layer as θp=90°, it is necessary to provide an exchange coupling magnetic bias Hex sufficiently greater than the longitudinal magnetic field Hhm, the applied external magnetic field Happl, the magnetic field induced by the sense current His and the self-demagnetization magnetic field of the pinned layer Hdp. However, the exchange coupling magnetic bias Hex will be typically 200–1000 Oe, whereas the longitudinal magnetic field Hhm is not negligible as 100–2000 Oe. Therefore, into the pinned layer, particularly to the areas near its track-width ends, a strong longitudinal magnetic bias is applied causing θp to become an angle much smaller than 90°. Also, θp over the whole area of the pinned layer will become smaller than 90°. In addition, if the temperature of the spin valve effect multi-layered stricture increases, the exchange coupling magnetic bias Hex component of the anti-ferromagnetic material with a lower blocking temperature decreases, causing the pinned direction to incline toward the longitudinal bias direction and thus causing θp to further decrease. However, according to the present invention, because the direction of the exchange coupling magnetic bias Hex is set to compensate for such a decrease of θp, the finally composed θp becomes substantially equal to 90°.

It is preferred that the Hex angle is equal to or less than 130°. It is also preferred that the Hex angle is more than 90° over the whole area of the pinned layer.

It is preferred that the Hex angle in both longitudinal end portions of the pinned layer is greater than the Hex angle in a center portion of the pinned layer. Preferably, this Hex angle is equal to or more than 100° and equal to or less than 140° in both the longitudinal end portions of the pinned layer.

According to the present invention, furthermore, a method of manufacturing a thin-film magnetic head has a step of forming a spin valve effect multi-layered structure including a non-magnetic electrically conductive material layer, first and second ferromagnetic material layers (free and pinned layers) separated by the non-magnetic electrically conductive material layer, and an anti-ferromagnetic material layer formed adjacent to and in physical contact with one surface of the second ferromagnetic material layer, the one surface being an opposite side of the non-magnetic electrically conductive material layer, the multi-layered structure having ends at its track-width direction, a step of forming longitudinal bias means at both the track-width ends of the multi-layered structure, the means providing a longitudinal magnetic bias to the multi-layered structure, and a step of annealing the multi-layered structure at a temperature equal to or less than the blocking temperature of the anti-ferromagnetic material layer under application of magnetic field to the multi-layered structure, for providing exchange coupling between the anti-ferromagnetic material layer and the second ferromagnetic material layer. The exchange coupling produces an exchange coupling magnetic bias in the second ferromagnetic material layer. An angle between a direction of the produced exchange coupling magnetic bias in the second ferromagnetic material layer and a direction of the longitudinal magnetic bias in the second ferromagnetic material layer is greater than 90°.

By executing the annealing step, the Hex angle, which is the angle between the direction of the exchange coupling magnetic bias applied to the pinned layer (pinned direction) and the longitudinal bias direction (reference direction) is set to an angle greater than 90° at least part of the pinned layer. Thus, even if the longitudinal bias means is formed, the angles θp between the directions of the finally composed magnetization and the reference direction under no magnetic field environment become substantially 90°. In other words, the total angles θp in the pinned layer becomes substantially 90° (θp=90°). As a result, improved output characteristics, namely, improved output wave shape and improved wave symmetry, and also an enlarged permissible temperature range can be expected.

It is preferred that the annealing step provides the exchange coupling between the anti-ferromagnetic material layer and the pinned layer so that the Hex angle is equal to or less than 130°.

According to the present invention, also, a method of manufacturing a thin-film magnetic head has a step of forming a spin valve effect multi-layered structure including a non-magnetic electrically conductive material layer, first and second ferromagnetic material layers separated by the non-magnetic electrically conductive material layer, and an anti-ferromagnetic material layer formed adjacent to and in physical contact with one surface of the second ferromagnetic material layer, the one surface being an opposite side of the non-magnetic electrically conductive material layer, the multi-layered structure having ends at its track-width direction, a step of forming a longitudinal bias means at both the track-width ends of the multi-layered structure, for providing a longitudinal magnetic bias to the multi-layered structure, a step of magnetizing the longitudinal bias means toward in a direction opposite a reference direction for the longitudinal magnetic bias, a step of annealing the multi-layered structure at a temperature equal to or less than the blocking temperature of the anti-ferromagnetic material layer under application of magnetic field in a direction perpendicular to the reference direction for the longitudinal magnetic bias to the multi-layered structure, for producing exchange coupling between the anti-ferromagnetic material layer and the second ferromagnetic material layer, the exchange coupling producing exchange coupling magnetic bias in the second ferromagnetic material layer, and a step of magnetizing again the longitudinal bias means toward the reference direction for the longitudinal magnetic bias.

Since the longitudinal bias means are magnetized toward the opposite to a reference direction for the longitudinal magnetic bias and thereafter an annealing step for providing the exchange coupling between the anti-ferromagnetic material layer and the pinned layer to produce exchange coupling magnetic bias in this pinned layer, the Hex angle in both longitudinal end portions of the pinned layer becomes more than 90° and the Hex angle in a center portion of the pinned layer becomes about 90°. In other words, during the annealing process, in the longitudinal end portions of the pinned layer, the longitudinal magnetic bias Hhm operates causing the Hex angle of the composed exchange coupling bias to become more than 90°. Thus, after again the longitudinal bias means is magnetized again toward the normal direction, the angles θp between the directions of the finally composed magnetization and the reference direction under no magnetic field environment become substantially 90°. In other words, the total angles θp over the whole area in the pinned layer become substantially 90° (θp≈90°). As a result, improved output characteristics, namely improved output wave shape and improved wave symmetry, and also an enlarged permissible temperature range can be expected.

It is preferred that the annealing step provides the exchange coupling between the anti-ferromagnetic material layer and the pinned layer so that the Hex angle is equal to or more than 100° and equal to or less than 140° in both the longitudinal end portions of the pinned layer.

It is also preferred that the method further has a step of controlling anisotropy of the free layer, executed before the annealing step.

According to the present invention, furthermore, a MR sensor has a magnetic multi-layered structure including a non-magnetic electrically conductive material layer, first and second ferromagnetic material layers separated by the non-magnetic electrically conductive material layer, and an anti-ferromagnetic material layer formed adjacent to and in physical contact with one surface of the second ferromagnetic material layer. This one surface is an opposite side of the non-magnetic electrically conductive material layer. The multi-layered structure is formed such that an angle between a direction of exchange coupling magnetic bias in the second ferromagnetic material layer produced by the exchange coupling with the anti-ferromagnetic material layer and a magnetically sensitive surface direction of the magnetoresistive effect sensor is more than 90° in at least part of the second ferromagnetic material layer.

Also, according to the present invention, a thin-film magnetic head has a magnetic multi-layered structure including a non-magnetic electrically conductive material layer, first and second ferromagnetic material layers separated by the non-magnetic electrically conductive material layer, and an anti-ferromagnetic material layer formed adjacent to and in physical contact with one surface of the second ferromagnetic material layer. This one surface is an opposite side of the non-magnetic electrically conductive material layer. The multi-layered structure is formed such that an angle between a direction of exchange coupling magnetic bias in the second ferromagnetic material layer produced by the exchange coupling with the anti-ferromagnetic material layer and a track-width direction of the thin-film magnetic head is more than 90° in at least part of the second ferromagnetic material layer.

Further objects and advantages of the present invention will be apparent from the following description of the preferred embodiments of the invention as illustrated in the accompanying drawings.

DESCRIPTION OF THE PREFERRED EMBODIMENTS

Figure 1:
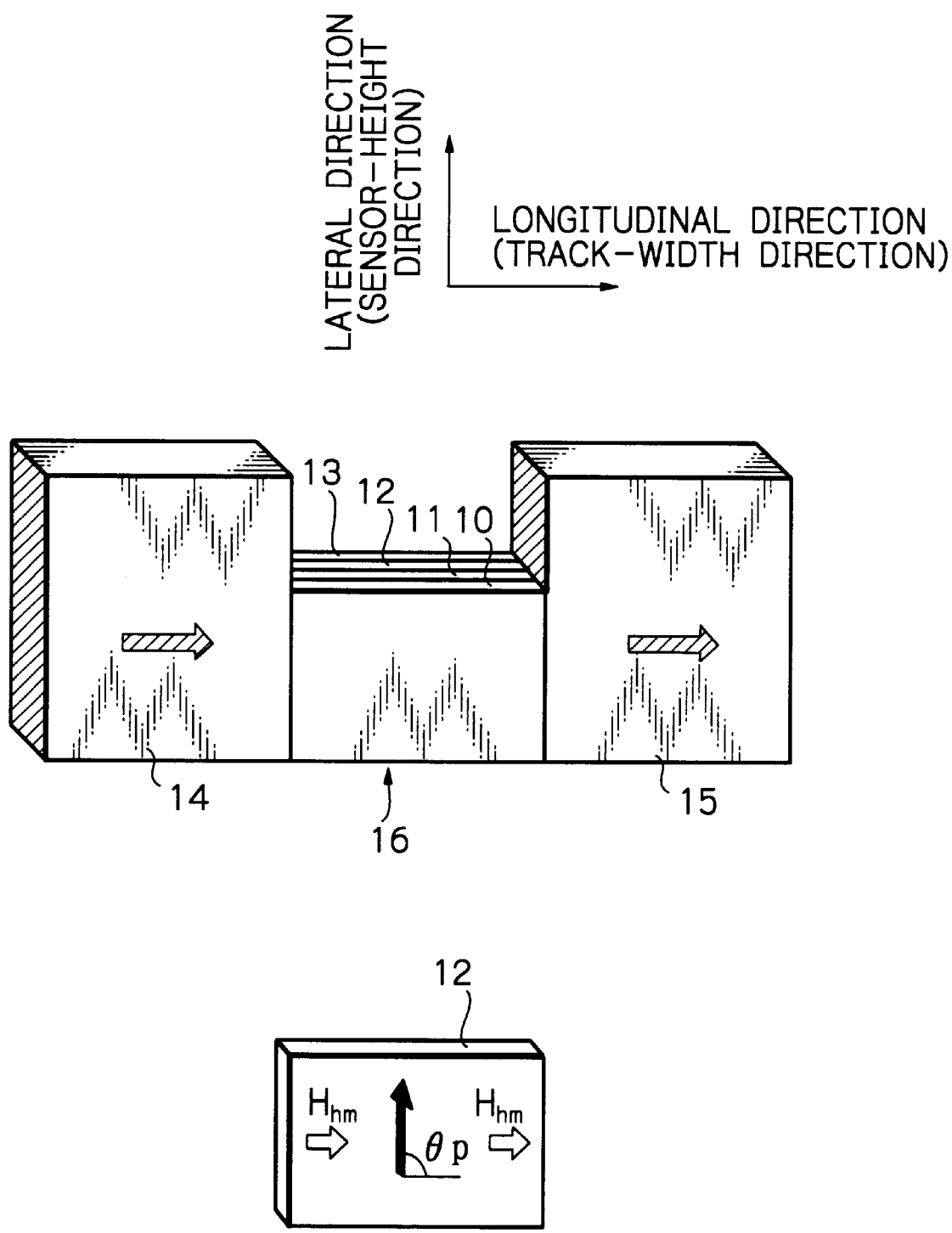
FIG. 1 shows an oblique view of a spin valve effect multi-layered structure formed in a spin valve effect MR sensor of a thin-film magnetic head as a preferred embodiment according to the present invention.

FIG. 1 illustrates a spin valve effect multi-layered structure and hard magnet layers for producing longitudinal magnetic bias of a spin valve effect Mr sensor of a thin-film magnetic head. Referring to FIG. 1, reference numerals 10 and 12 denote first and second ferromagnetic thin-film layers, respectively, which are magnetically separated by a thin-film layer 11 of a non-magnetic electrically conductive material. On the second ferromagnetic thin-film layer 12, a thin-film layer 13 of anti-ferromagnetic material is stacked, and a magnetic field generated by the exchange coupling at the interface of the thin-film layers 12 and 13 magnetizes the ferromagnetic layer 12, and, so to speak, the layer is pinned. Thus, the second ferromagnetic layer 12 is referred to as a pinned layer. The first ferromagnetic thin-film layer 10 is a free layer in which there is no effect of exchange coupling and hence the magnetization is free to rotate in response to an externally applied magnetic field. In FIG. 1, furthermore, reference numerals 14 and 15 denote hard magnet layers formed to contact with the both end portions in the track-width direction of the spin valve effect multi-layered structure 16 for providing longitudinal magnetic bias toward one direction to the free layer 10 of the multi-layered structure 16. Stacked structures of anti-ferromagnetic material layers and ferromagnetic material layers may be used for providing the longitudinal magnetic bias instead of the permanent magnet layers 14 and 15. Thus, the second ferromagnetic layer 12 is called as a pinned layer. The first ferromagnetic thin-film layer 10 is a free layer in which there is no effect of exchange coupling and hence the magnetization is free to rotate in response to an externally applied magnetic field. In FIG. 1, furthermore, reference numerals 14 and 15 denote hard magnet layers formed to contact with the both end portions in the track-width direction of the spin valve effect multi-layered structure 16 for providing longitudinal magnetic bias toward one direction to the free layer 10 of the multi-layered structure 16. Stacked structures of anti-ferromagnetic material layers and ferromagnetic material layers may be used for providing the longitudinal magnetic bias in stead of the permanent magnet layers 14 and 15.

According to the invention, the constitution of the spin valve effect structure is not limited to a specific embodiment. Each layer of the structure can be made of any material with the necessary function. For example, the anti-ferromagnetic material layer 13 can be made of PtMn, NiMn or IrMn, the second ferromagnetic material layer 12 can be made of Co, FeCo or NiFe, the non-magnetic metallic material layer 11 can be made of Cu, Ag or Au, and the first ferromagnetic material layer 10 can be made of FeCo, NiCo or FeCoNi. The hard magnet layers 14 and 15 can be made of CoPt, CoCrPt or SmCo. The spin valve effect structure 16 can additionally include a seed or under layer, an electron reflection layer, a bias cancellation layer and/or a protection layer. Furthermore, the stacking order of each layer of the structure can be inverted as from the substrate the anti-ferromagnetic material layer, the second ferromagnetic material layer, the non-magnetic metallic material layer and the first ferromagnetic material layer.

In the aforementioned specific embodiment, AlTiC is used for the substrate, a two-layered structure of NiFe/Co is used for the first ferromagnetic material layer (free layer) 10, Cu is used for the non-magnetic metallic material layer 11, Co is used for the second ferromagnetic material layer (pinned layer) 12, and FeMn is used for the anti-ferromagnetic material layer 13. To fabricate the spin valve effect structure 16, an under seed layer of $Al_2O_3$, an under shield layer of FeAlSi and an under gap layer of $Al_2O_3$ are deposited on an AlTiC substrate (wafer), and thereafter, a seed layer of Ta with 5 nm thickness, ferromagnetic material layers of NiFe with 9 nm thickness and Co with nm thickness which constitute the free layer 10, a non-magnetic metallic material layer 11 of Cu with 2.5 nm thickness, a ferromagnetic material layer of Co with 2.5 nm of thickness which constitutes the pinned layer 12, an anti-ferromagnetic material layer 13 of FeMn with 10 nm thickness and a protection layer of Ta with 5 nm thickness are sequentially deposited by Rf sputtering.

After a patterned resist layer is formed, ion milling patterns the spin valve effect structure 16. Then, a seed layer of TiW with 10 nm thickness, magnet layers 14 and 15 of CoPt with 50 nm thickness and lead conductor layers of Ta with 50 nm thickness are stacked. Thereafter, an upper gap layer of $Al_2O_3$ and an upper shield layer of NiFe are stacked. Thus, on the wafer, many spin valve effect MR sensors are formed. The above-mentioned processes for fabricating the MR sensors are known processes.

According to the present invention, the following specific annealing processes for thus fabricated wafer to magnetize the free layer 10 and the pinned layer 12 of each MR sensor in directions orthogonal to each other are executed.

Figure 2A:
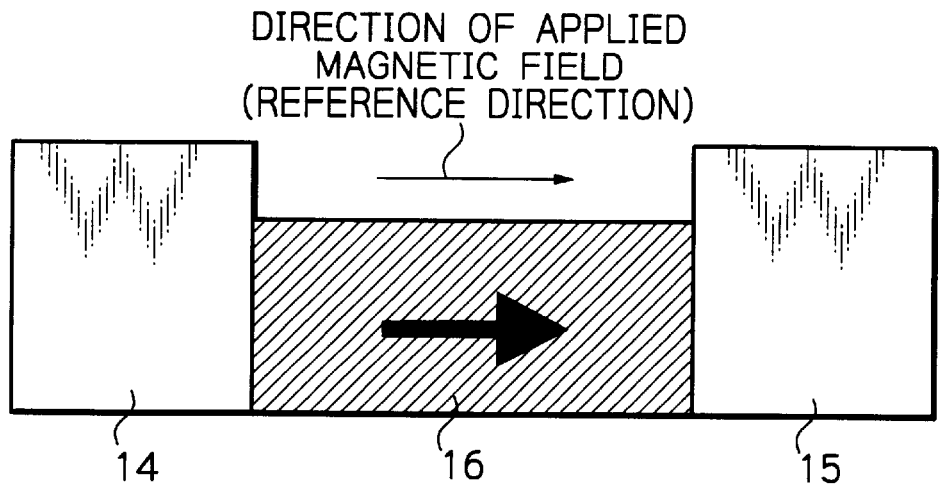
FIGS. 2a to 2c show sectional views illustrating procedure of an annealing process in manufacturing the thin-film magnetic head of the embodiment of FIG. 1.

First, an annealing process of the free layer 10 is executed. In this annealing process, as shown in FIG. 2a, the wafer is heated at about 250° C. under application of an external magnetic field of 1–3 kOe in a longitudinal direction (track-width direction) of each spin valve effect Mr sensor which is hereinafter referred to as a direction of longitudinal magnetic bias or a reference direction so that the axis of easy magnetization of the free layer 10 in each Mr sensor is directed toward the reference direction.

Figure 2B:
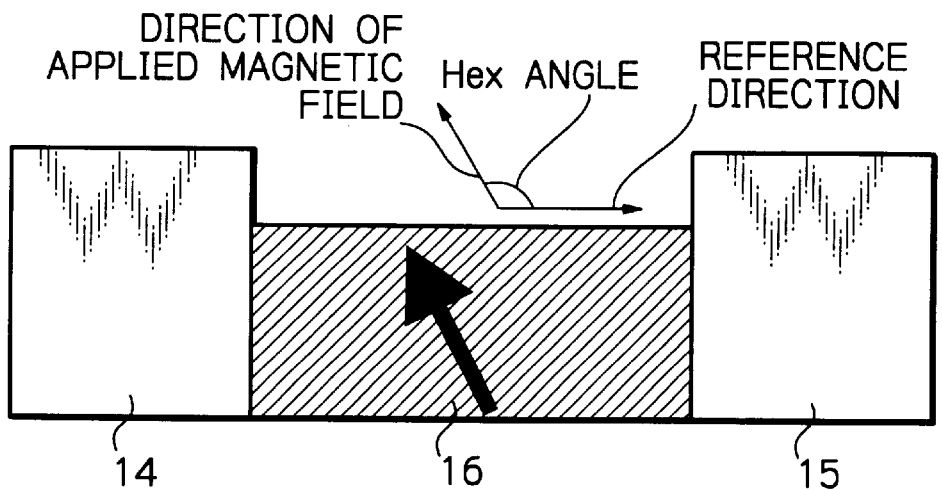

Then, an annealing process for providing the exchange coupling magnetic bias to each spin valve effect Mr sensor is executed. In this annealing process, the temperature of the wafer is decreased to about 160° C. and then the wafer is rotated by an angle which is greater than 90° but equal to or less than 130° under the application of the above-mentioned external magnetic field. Thus, the applied external magnetic field forms an angle that is more than 90° but equal to or less than 130° from the reference direction. The temperature of the wafer is then decreased to room temperature. According to this process, as shown in FIG. 2b, the exchange coupling magnetic bias Hex forms an angle which is more than 90° but equal to or less than 130° from the reference direction.

Then, a magnet magnetization process is executed. In this process, a shown in FIG. 2c, the hard magnet layers 14 and 15 are magnetized toward the reference direction at normal room temperature so that the magnet layers 14 and 15 produce the longitudinal magnetic bias Hhm (FIG. 1) in the reference direction.

Figure 2C:
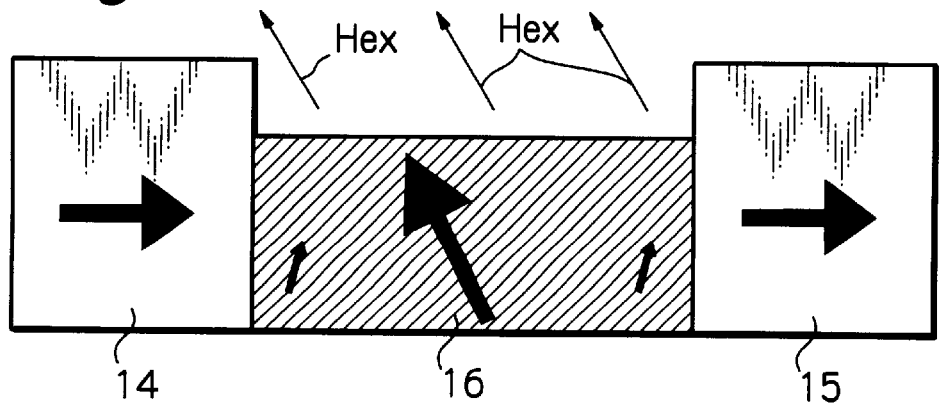

As aforementioned, the latter annealing process provides the exchange coupling magnetic bias with the Hex angle of more than 90° over the whole region of the pinned layer 12 of each MR sensor. Thus, after the magnet magnetization process is executed, although angles θp between the directions of the finally composed magnetization and the reference direction become less than 90° at the both end portions of the pinned layer 12 of each MR sensor as shown in FIG. 2c, the total angles θp become substantially 90° (θp≈90°) over the whole area of the pinned layer 12 as shown in FIG. 1.

Figure 3:
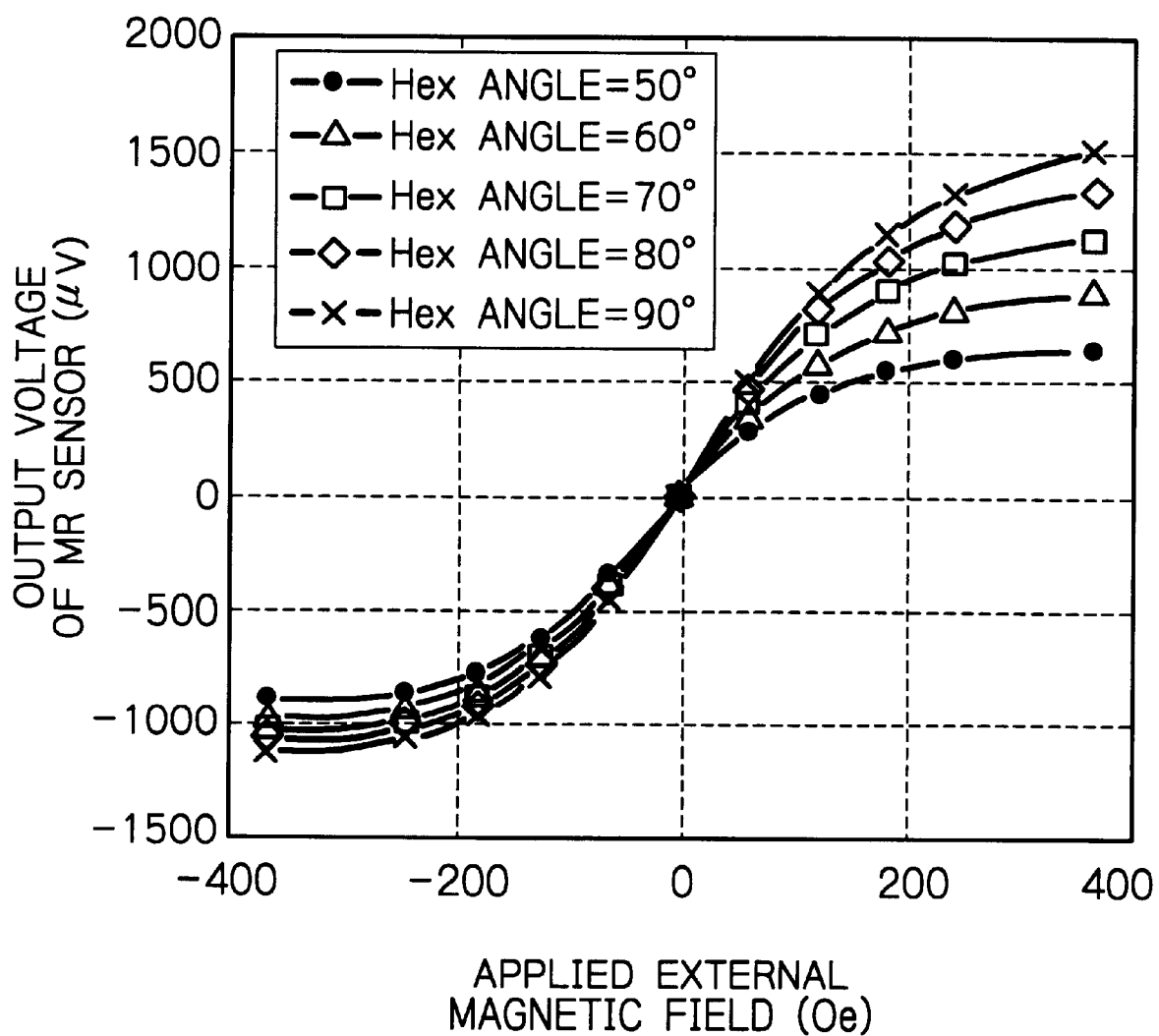
FIG. 3 shows a graph of output voltage characteristics versus applied external magnetic field of a spin valve effect MR sensor with different Hex angles.
Figure 4:
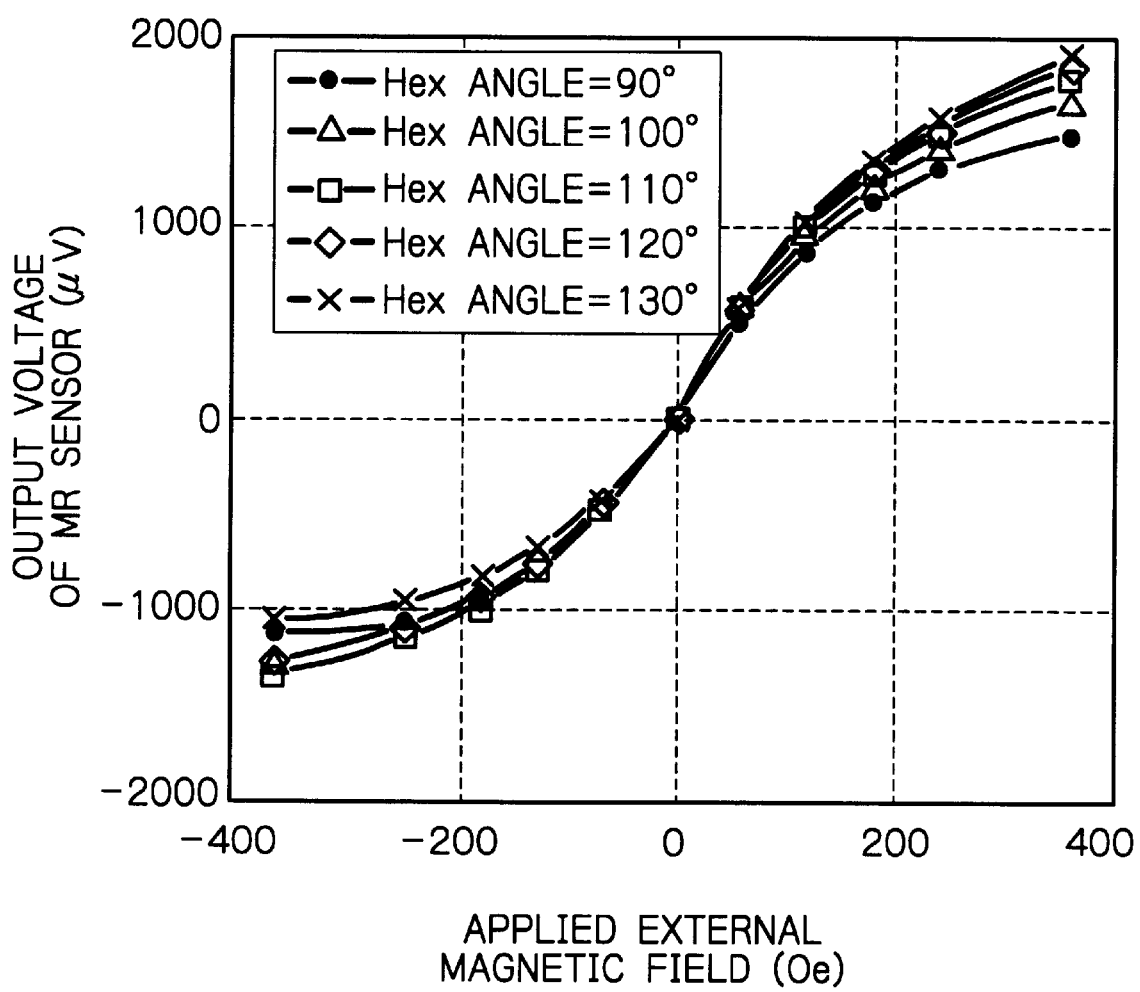
FIG. 4 shows a graph of output voltage characteristics versus applied external magnetic field of the spin valve effect MR sensor with different Hex angles.

FIGS. 3 and 4 illustrate measured results of output voltage characteristics versus applied external magnetic field of a spin valve effect MR sensor with different Hex angles of 50° to 130°. The different Hex angles were provided to the sensor by changing the direction of the applied external magnetic field during the annealing process at angles of 50° to 130° from the reference direction. The measurements were done for the spin valve effect MR sensor at normal room temperature using a ρ-H tester. During the measurement, a sense current of 4 mA flowing toward the against direction which would result good symmetry in wave shape was applied to the sensor.

Figure 5:
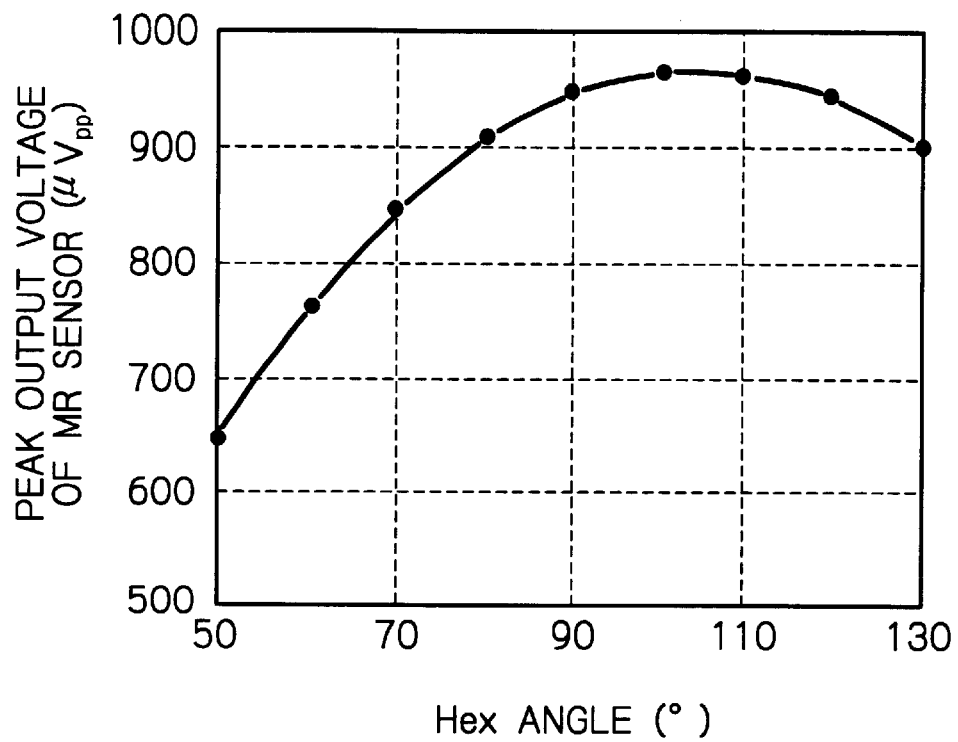
FIG. 5 shows a graph of peak output voltage characteristics versus Hex angle of the spin valve effect MR sensor.
Figure 6:
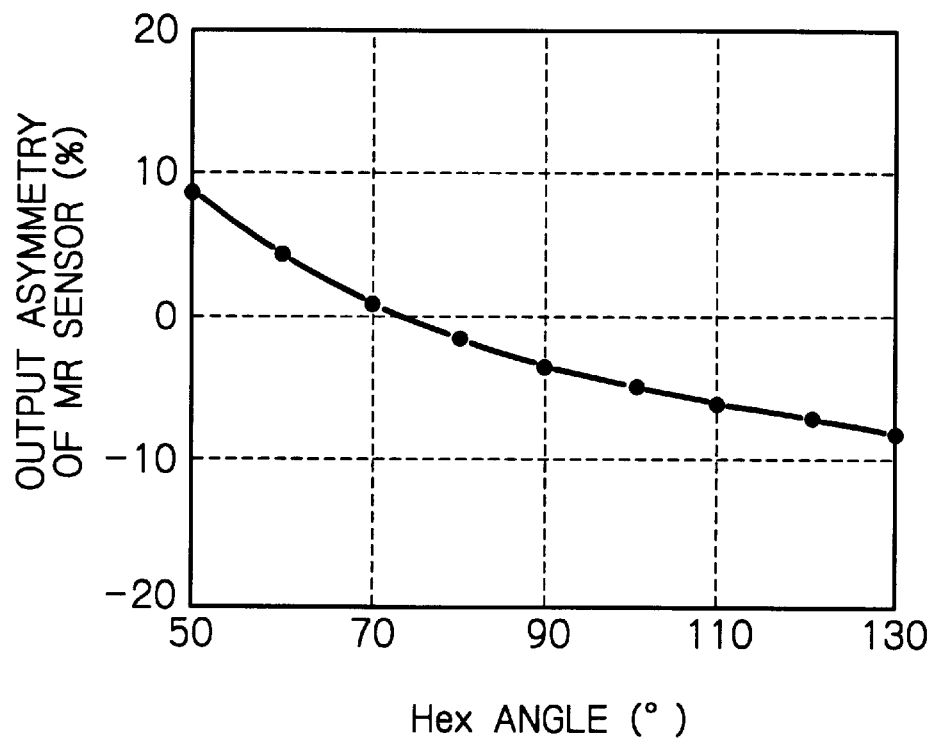
FIG. 6 shows a graph of output asymmetry characteristics versus Hex angle of the spin valve effect MR sensor.

FIG. 5 illustrates peak output voltage characteristics versus Hex angle of the spin valve effect MR sensor, obtained by calculating the aforementioned measured results of output voltage characteristics with respect to the applied external magnetic field. Also, FIG. 6 illustrates output asymmetry characteristics versus Hex angle of the spin valve effect MR sensor. As will be apparent from these figures, an output voltage of 900 μV or more can be obtained from the spin valve effect MR sensor and asymmetry of the output voltage can be kept within a permissible range when the Hex angle is more than 90° but equal to or less than 130°.

Figure 7:
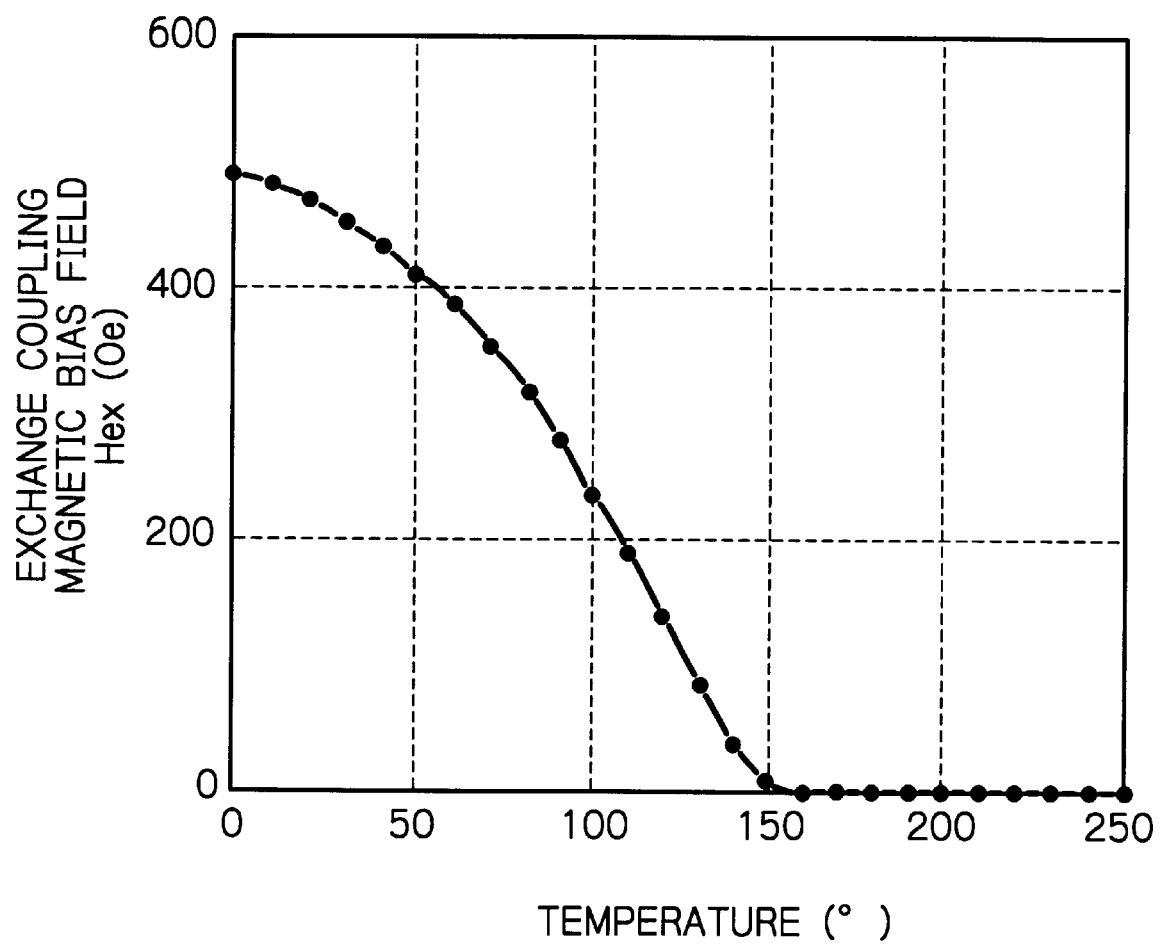
FIG. 7 shows a graph of exchange coupling magnetic bias versus temperature of the spin valve effect MR sensor of the embodiment of FIG. 1.

FIG. 7 illustrates temperature dependency of the exchange coupling magnetic bias Hex of the spin valve effect MR sensor of this embodiment. The higher the temperature of the sensor, the lower the exchange coupling magnetic bias Hex. At about 160° C., Hex=0.

Figure 8:
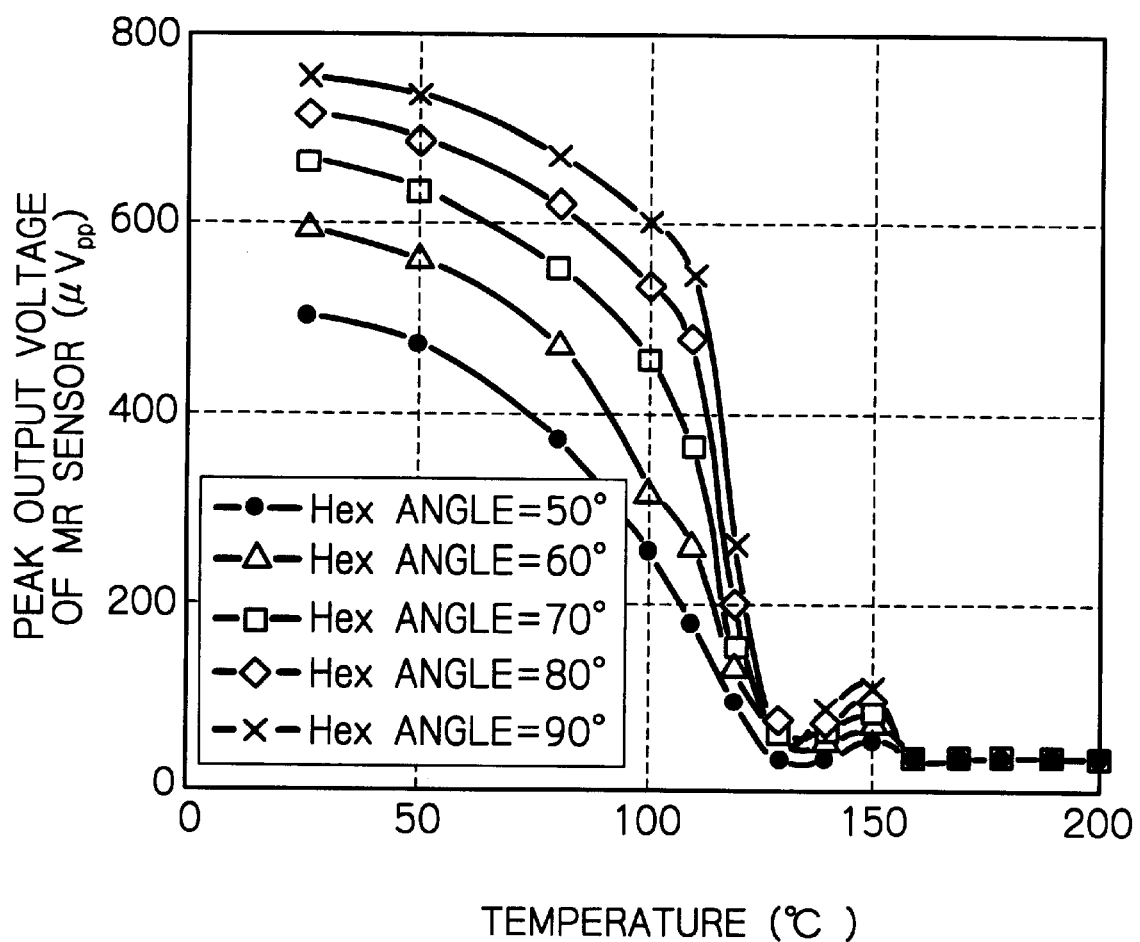
FIG. 8 shows a graph of peak output voltage characteristics versus temperature of a spin valve effect MR sensor with different Hex angles.
Figure 9:
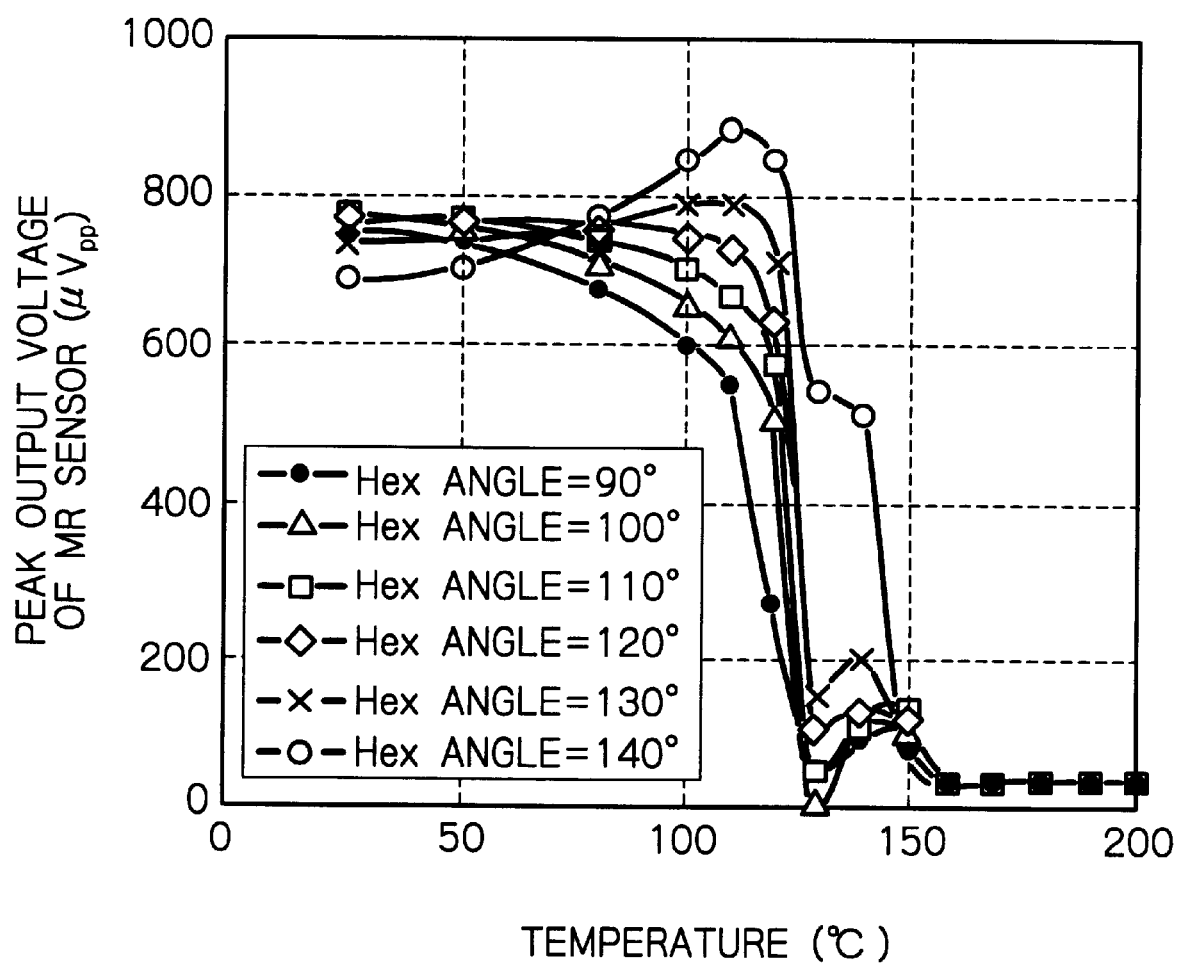
FIG. 9 shows a graph of peak output voltage characteristics versus temperature of a spin valve effect MR sensor with different Hex angles.

FIGS. 8 and 9 illustrate peak output voltage characteristics versus temperature of the spin valve effect MR sensor with different Hex angles under uniform magnetic field of 60 Oe.

As shown in FIG. 8, when the Hex angle is between 50° and 90°, the larger Hex angle, the higher peak output voltage is provided. Within this range of the Hex angle, the peak output voltage is not kept high when the temperature increases. Also, as shown in FIG. 9, when the Hex angle is between 90° and 130°, substantially the same peak output voltage is provided at the normal room temperature of about 25° C. for the different Hex angles. Within this range of the Hex angle, the peak output voltage is kept high as well as that at the normal room temperature even when the temperature is within 50° C. to 120° C. Thus, it will be understood that, when the Hex angle is between 90° and 130°, a high peak output voltage can be expected and this high peak output voltage can be maintained even if the temperature of the MR sensor increases.

FIGS. 10a to 10d illustrate procedure of an annealing process in manufacturing a thin-film magnetic head as another embodiment according to the present invention. In this embodiment, the constitution of the spin valve effect structure and the wafer fabricating processes except for annealing processes are the same as these in the embodiment shown in FIG. 1. Therefore, the following explanation of this embodiment is executed about annealing processes for the fabricated wafer to magnetize the free layer 10 and the pinned layer 12 of each MR sensor in directions orthogonal to each other.

Figure 10A:
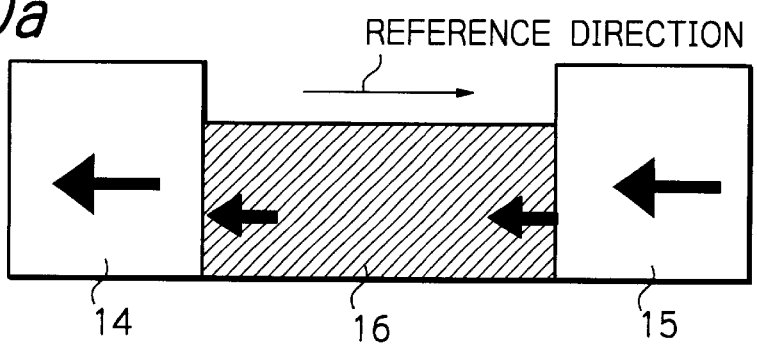
FIGS. 10a to 10d show sectional views illustrating procedure of an annealing process in manufacturing a thin-film magnetic head as another embodiment according to the present invention.

A first magnet magnetization process is executed. In this process, as shown in FIG. 10a, the hard magnet layers 14 and 15 are magnetized toward in a direction opposite that of the reference direction at normal room temperature so that the magnet layers 14 and 15 produce the longitudinal magnetic bias in the opposite direction against the reference direction.

Figure 10B:
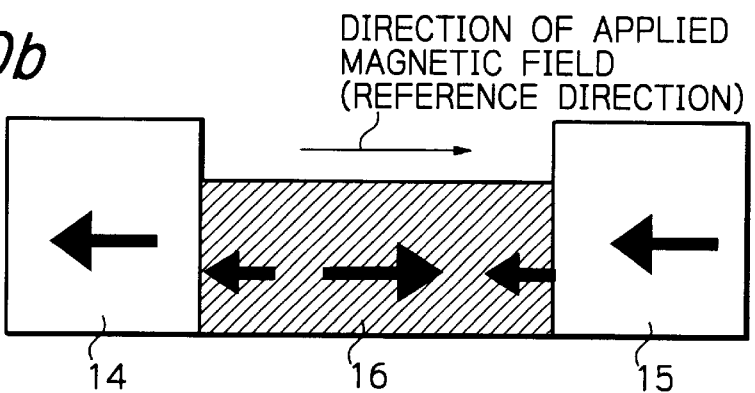

Then, an annealing process of the free layer 10 is executed. In this annealing process, as shown in FIG. 10b, the wafer is heated at about 250° C. under application of external magnetic field of 1–3 kOe in the reference direction so that the axis of easy magnetization of the free layer 10 in each MR sensor is directed toward the reference direction.

Figure 10C:
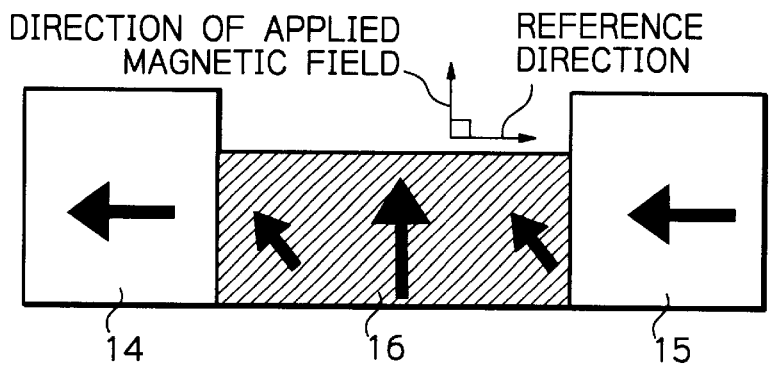

Then, an annealing process for providing the exchange coupling magnetic bias to each spin valve effect MR sensor is executed. In this annealing process, the temperature of the wafer is decreased to about 160° C. and then the wafer is rotated by 90° under the application of the above-mentioned external magnetic field. Thus, the applied external magnetic field forms 90° from the reference direction. The temperature of the wafer is then decreased to a room temperature. According to this process, as shown in FIG. 10c, at the center portion of the pinned layer 12, since there is no influence of the longitudinal magnetic bias in the opposite direction against the reference direction, the exchange coupling magnetic bias Hex forms 90° from the reference direction. Whereas, at the both end portions of the pinned layer 12, because there exists influence of the longitudinal magnetic bias in the opposite direction against the reference direction, the exchange coupling magnetic bias Hex forms an angle of more than 90° from the reference direction.

In case that residual magnetization of the hard magneto layers of CoPt 14 and 15 is 750 emu/cm$^3$, if the thickness of these layers are 20–50 nm, the longitudinal magnetic bias in the opposite direction against the reference direction of 250–1000 Oe will be applied into areas of the pinned layer 12 lying up to about 0.15 μm length from the track ends. Thus, if the exchange coupling magnetic bias of 1000–2000 Oe in the transverse direction is provided at the annealing process, the composed magnetization of the lateral exchange coupling magnetic bias and the longitudinal magnetic bias will become equal to or more than 1000 and equal to or less than 130° with respect to the reference direction.

Figure 10D:
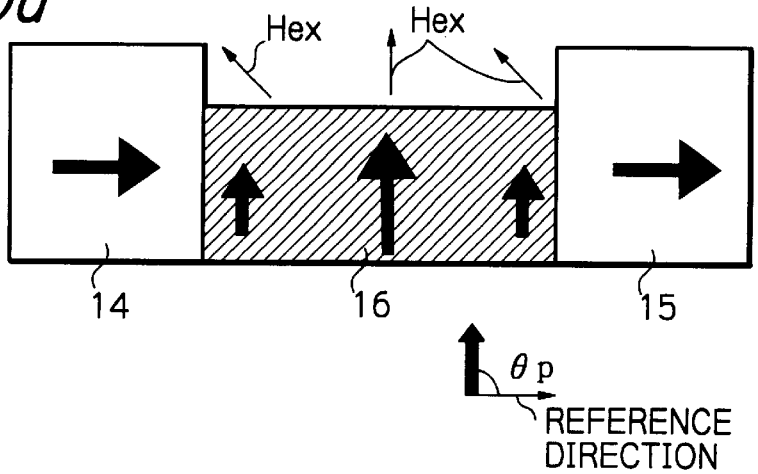

Then, a second magnet magnetization process is executed. In this process, as shown in FIG. 10d, the hard magnet layers 14 and 15 are magnetized toward the reference direction at the normal room temperature so that the magnet layers 14 and 15 produce the longitudinal magnetic bias in the reference direction.

As aforementioned, the exchange coupling bias annealing process provides the exchange coupling magnetic bias with the Hex angle of 100°–140° at the both end portions of the pinned layer 12 of each MR sensor. Thus, after the second magnet magnetization process is executed, angles θp between the directions of the finally composed magnetization and the reference direction become substantially 90° (θp ≈90°) over the whole area of the pinned layer 12.

Many widely different embodiments of the present invention may be constructed without departing from the spirit and scope of the present invention. It should be understood that the present invention is not limited to the specific embodiments described in the specification, except as defined in the appended claims.

What is claimed is:

1. A method of manufacturing a thin-film magnetic head comprising the steps of:

forming a spin valve effect multi-layered structure including a non-magnetic electrically conductive material layer, first and second ferromagnetic material layers separated by said non-magnetic electrically conductive material layer, and an anti-ferromagnetic material layer formed adjacent to and in physical contact with one surface of said second ferromagnetic material layer opposite said non-magnetic electrically conductive material layer, said multi-layered structure having ends at its track-width direction;

forming longitudinal bias means at both said track-width ends of said multi-layered structure, said means providing a longitudinal magnetic bias to said multi-layered structure; and annealing said multi-layered structure at a temperature equal to or less than the blocking temperature of said anti-ferromagnetic material layer under application of a magnetic field to said multi-layered structure, for providing exchange coupling between said anti-ferromagnetic material layer and said second ferromagnetic material layer, said exchange coupling producing exchange coupling magnetic bias in said second ferromagnetic material layer, an angle between the direction of said produced exchange coupling magnetic bias in said second ferromagnetic material layer and the direction of said longitudinal magnetic bias in said second ferromagnetic material layer being more than 90°.

2. The method as claimed in claim 1, wherein said annealing step provides the exchange coupling between said anti-ferromagnetic material layer and said second ferromagnetic material layer so that the angle between the direction of said exchange coupling magnetic bias and the direction of said longitudinal magnetic bias is equal to or less than 130°.

3. The method as claimed in claim 1, wherein said method further comprises a step of controlling anisotropy of said first ferromagnetic material layer so that the axis of easy magnetization of said first ferromagnetic material layer is directed toward the direction of said longitudinal magnetic bias, said control step being executed before said annealing step.

4. A method of manufacturing a thin-film magnetic head comprising the steps of:

forming a spin valve effect multi-layered structure including a non-magnetic electrically conductive material layer, first and second ferromagnetic material layers separated by said non-magnetic electrically conductive material layer, and an anti-ferromagnetic material layer formed adjacent to and in physical contact with one surface of said second ferromagnetic material layer opposite said non-magnetic electrically conductive material layer, said multi-layered structure having ends at its track-width direction;

forming longitudinal bias means at both said track-width ends of said multi-layered structure, for providing a longitudinal magnetic bias to said multi-layered structure;

magnetizing said longitudinal bias means in a direction opposite a reference direction for the longitudinal magnetic bias;

annealing said multi-layered structure at a temperature equal to or less than the blocking temperature of said anti-ferromagnetic material layer under application of a magnetic field in a direction perpendicular to the reference direction for the longitudinal magnetic bias, for providing exchange coupling between said anti-ferromagnetic material layer and said second ferromagnetic material layer, said exchange coupling producing exchange coupling magnetic bias in said second ferromagnetic material layer; and magnetizing again said longitudinal bias means toward the reference direction for the longitudinal magnetic bias.

5. The method as claimed in claim 4, wherein said second ferromagnetic material layer has longitudinal end portions, and wherein said annealing step is a step of providing the exchange coupling between said anti-ferromagnetic material layer and said second ferromagnetic material layer so that the angle between the direction of said produced exchange coupling magnetic bias and the direction of said longitudinal magnetic bias is equal to or more than 100° and equal to or less than 140° in both said longitudinal end portions of said second ferromagnetic material layer.

6. The method as claimed in claim 4, wherein said method further comprises a step of controlling anisotropy of said first ferromagnetic material layer so that the axis of easy magnetization of said first ferromagnetic material layer is directed toward the direction of said longitudinal magnetic bias, said control step being executed before said annealing step.

* * * * *